United States Patent [19]

Chakrabarti

[11] Patent Number: 5,220,485
[45] Date of Patent: Jun. 15, 1993

[54] HEAT REMOVING EDGE GUIDE SYSTEM AND RELATED METHOD

[75] Inventor: Kalyan K. Chakrabarti, Palm Bay, Fla.

[73] Assignee: Harris Corporation, Melbourne, Fla.

[21] Appl. No.: 728,974

[22] Filed: Jul. 12, 1991

Related U.S. Application Data

[63] Continuation-in-part of Ser. No. 510,736, Apr. 18, 1990, abandoned.

[51] Int. Cl.⁵ .............................................. H05K 7/20
[52] U.S. Cl. .................................. 361/386; 165/80.3; 165/185; 361/383; 361/388; 174/16.3
[58] Field of Search ..................... 165/80, 185; 357/81; 174/16.3; 361/386, 388-389, 400

[56] References Cited

U.S. PATENT DOCUMENTS

| | | | |
|---|---|---|---|
| 3,735,206 | 5/1973 | Pesek | 361/386 |
| 4,096,547 | 6/1978 | Calabro | 361/388 |
| 4,318,157 | 3/1982 | Rank et al. | 361/388 |
| 4,330,812 | 5/1982 | Token | 361/386 |
| 4,375,290 | 3/1983 | Zucchi et al. | 277/12 |
| 4,442,475 | 4/1984 | Franklin et al. | 361/383 |
| 4,459,639 | 7/1984 | Heil et al. | 361/383 |
| 4,475,145 | 10/1984 | Heil et al. | 361/386 |
| 4,480,287 | 10/1984 | Jensen | 361/388 |
| 4,536,824 | 8/1985 | Barrett et al. | 361/384 |
| 4,550,836 | 11/1985 | Ellis | 211/41 |
| 4,819,713 | 11/1989 | Weisman | 361/388 |

FOREIGN PATENT DOCUMENTS

2103020  2/1983 United Kingdom ................ 361/386

*Primary Examiner*—Gregory D. Thompson
*Attorney, Agent, or Firm*—Evenson, Wands, Edwards, Lenahan & McKeown

[57] ABSTRACT

A heat removing edge guide system removes heat from a circuit board. The system includes a heat sink plate, a stationary guide fixed to the mounting surface of the heat sink plate, and a moving guide slidably mounted on a top surface of the stationary guide. Sliding of the moving guide along the upper surface of the stationary guide causes a change in the vertical distance between the mounting surface of the heat sink plate and the upper surface of the moving guide. The moving guide, the stationary guide and the heat sink plate form a thermally conductive path. A screw-adjusted side guide can also be provided to cause a wedging with a lateral wall of the chassis support and thus provide an additional heat sink path and system stability. A method of providing a thermally conductive heat sink path for removal of heat from the circuit board in the edge guide system includes the mounting of the heat sink plate on a spaced fin extending from a support wall, the sliding of the moving guide along the upper surface of the stationary guide until the upper surface of the moving guide contacts a spaced fin located adjacent to the fin on which the heat sink plate is mounted, and the varying of the distance between the moving guide and the outer surface of a side guide until the outer surface of the side guide contacts the support wall.

6 Claims, 6 Drawing Sheets

HEAT REMOVING EDGE GUIDE SYSTEM AND RELATED METHOD

CROSS-REFERENCE TO RELATED APPLICATION

This is a continuation-in-part of application Ser. No. 07/510,736, filed Apr. 18, 1990, now abandoned which is incorporated by reference herein to the extent necessary.

BACKGROUND OF THE INVENTION

The present invention relates to edge guides which perform a heat sink function with respect to components mounted on a circuit board. More particularly, the present invention relates to edge guides which are attached to a heat sink plate on which a printed circuit board is mounted and which are used to provide a heat flow path from components of the circuit board to a chassis within which the board is mounted and to aid and provide stability in the mounting of the circuit board within the chassis.

In the mounting of circuit boards, it is usually essential to provide a heat sink for the electronic components borne by the boards. A typical heat sink is a piece of metal or some other heat conducting material that effectively draws heat away from the circuit board components and transfers this heat to the surrounding air. Heat sinks are often required because many electronic components (especially high power electronic components) tend to malfunction if the temperatures associated therewith rise above certain rated values. Since circuit boards are often mounted within small chassis enclosures in order to save space, it is common practice to provide a heat flow path between the chassis and the circuit components so that heat from such components can be radiated into the air surrounding the chassis.

However, as chassis enclosures become smaller and smaller in accordance with recent design trends, the problem of heat removal becomes more complex. More specifically, when heat-emanating components are densely packed within a small enclosure, heat within the enclosure builds up and therefore more efficient heat sink devices become necessary. Additionally, the use of small enclosure chassis results in circuit board mounting difficulties as the dense packing of the circuit boards within such chassis often leaves little room for adequate fastening of each of the circuit boards at a plurality of fastening points.

Heat removing edge guides have previously been used in an attempt to overcome the above-mentioned problems. Such guides are attached to heat sink plates upon which circuit boards ar mounted and provide an additional heat flow path between the circuit board components and the chassis or a cold wall support within the chassis in order to facilitate the removal of heat from the circuit board components. Additionally, the previously used heat removing edge guides aid in the mounting of the boards since the fastening of such boards requires only the simple rotation of easily accessible screws corresponding to the edge guides. A rotation of a screw associated with an edge guide causes the upper surface of a moving portion of that edge guide to contact a fin extending from the wall support and located adjacent to the edge guide in order to fasten or lock a particular board into place and to provide an additional heat flow path for each of the circuit components.

For example, U.S. Pat. No. 4,318,157 shows a device for removably mounting a printed circuit board to a chassis. An elongated shaft in the form of a jackscrew carries a plurality of ramps so as to be movable laterally thereof. A forcing mechanism on the shaft urges the ramps laterally in opposite direction and forces at least one of the ramps and the circuit board assembly against opposite wall portions of one of the channels in the chassis. Each of the intermediate ramps located between a first ramp and a bracket is formed of a heat conductive material and is trapezoidal in shape. These intermediate ramps are solid except for a central, longitudinal bore to accommodate the jackscrew. This is a relatively complex arrangement which requires multiple movable ramps and brackets to obtain the lateral movement. In addition, the movable ramps do not provide a continuous contact along the wall portions which decreases the heat transfer efficiency of the apparatus. Because there are multiple mating surfaces, uniform contact pressure cannot be assured.

Another retaining apparatus is shown in U.S. Pat. No. 4,819,713. Here, however, the ramps or wedges are not solid in order to be returned on the rail, in addition to constituting multiple ramps which is a more complex structure and is not as heat removal efficient as desired. The U-shaped structure of the wedges represents a very narrow surface which means a high thermal resistance and lower efficiency.

Although the previously used edge guides perform useful functions, they are still considered to provide less than satisfactory results. For example, heat removal through the additional heat flow path is nearly nonexistent due to the relatively small surface area of the adjacent fin surface contacting the upper surface of the moving portion. Since the surface area of the upper surface of the moving portion is relatively small due to its short length and width, heat removal through the upper surface of the moving portion and the adjacent fin is limited. Also, the short length and width of each moving portion results in less contact area between the upper surfaces of the moving portions and the fins adjacent thereto so that the pressure caused by rotation of each of the screws is focused on a smaller area and mounting stability is sacrificed in the edge guide system.

SUMMARY OF THE INVENTION

Accordingly, it is an object of the present invention to provide a heat removing edge guide system with a substantially continuous contact area between the upper surface of the moving portion of each edge guide and each corresponding fin located adjacent thereto and a greatly simplified apparatus which eliminates more complicated jackscrew arrangements while allowing the use of a solid moving guide to increase heat removal efficiency.

It is also an object of the present invention to provide a heat removing edge guide system wherein additional heat flow paths are provided in order to facilitate the removal of heat from various circuit board components.

Another object of the present invention is to provide a heat removing edge guide system wherein mounting stabilization is achieved due to an increase in the length of the edge guide moving portions which contact adjacent fins.

Yet another object of the present invention is to provide a heat removing edge guide system wherein the mounting of a circuit board within a chassis is facilitated.

In order to satisfy these objects, the present invention entails the use of an edge guide moving portion (i.e., a moving guide) having an increased length corresponding substantially to the length of the attachment or stationary guide on top of which it is mounted so that the contact area between the upper surface of the moving guide and an adjacent fin is increased, a greater amount of heat can be removed through the upper surface of the moving guide, and the mounting of the circuit board is stabilized due to the concentration of uniform contact pressure over a greater surface area.

Accordingly, the present invention is a heat removing edge guide system including a heat sink device having a stationary guide fixed thereon and a moving guide that is slidably mounted on top of the stationary guide. The upper surface of the stationary guide forms an angle or is inclined with respect to the heat sink device so that sliding of the moving guide along the upper surface of the stationary guide causes a change in the distance between the surface of the heat sink device and the upper surface of the moving guide. The stationary guide, the moving guide and the heat sink device of the present invention form a thermally conductive path.

The present invention can also include a side guide, encompassed within the thermally conductive path, that is positionally adjustable with respect to the moving guide so that the distance between the moving guide and the outer surface of the side guide can be varied.

Additionally, the present invention can include a support having a wall and a plurality of spaced fins for supporting the heat sink device. The support forms a part of the thermally conductive path and the fins and the wall of the support come into contact with the moving guide and the side guide, respectively, when the moving guide and the side guide are positionally adjusted.

Finally, the present invention entails a method of providing a thermally conductive heat sink path for removal of heat from a circuit board including the mounting of a heat sink device on a fin extending from a support wall, the sliding of a moving guide along the upper surface of a stationary guide mounted on the heat sink device until the moving guide contacts a fin located adjacent to the fin on which the heat sink device is mounted, and the varying of the distance between the moving guide and the outer surface of a side guide until the outer surface of the side guide contacts the support wall.

The advantages associated with the present invention include facilitation in mounting due to the adjustable positioning of the moving guide and the side guide, stability in mounting and improved heat removal stemming from the moving and side guides having a length substantially equal to the stationary guide, and the provision of additional heat sink paths through both the moving guide and the side guide.

DETAILED DESCRIPTION OF EMBODIMENTS OF THE INVENTION

Figure 1:
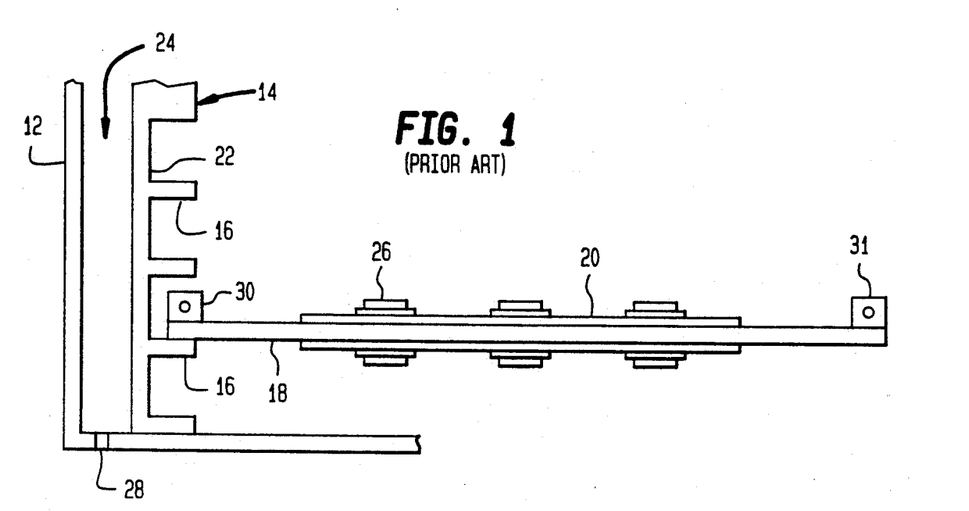
FIG. 1 is a side view of an edge guide system currently used in which a printed circuit board is mounted.

A printed circuit board can be mounted within an electronics chassis in the previously used edge guide system shown in FIG. 1. In such a system, support 14 located within chassis 12 has a number of spaced fins 16 for supporting a thermally conducting heat sink plate 18 on which a circuit board 20 or a plurality of such boards is mounted. Circuit board 20 bears electronic components 26 which generate heat. In order to prevent the electronic components from overheating, a thermally conductive heat flow path is provided whereby heat can flow from electronic components 26 on circuit board 20 through the circuit board and heat sink plate 18 to the fin 16 on which the heat sink plate is mounted. The conductive heat flow path also includes chassis 12 and wall 22 of support 14. Cooling of the circuit board 20 and the components 26 mounted thereon is particularly facilitated when cold fluid such as air is introduced into chamber 24 via inlet port 28.

Figures 2A, 2B:
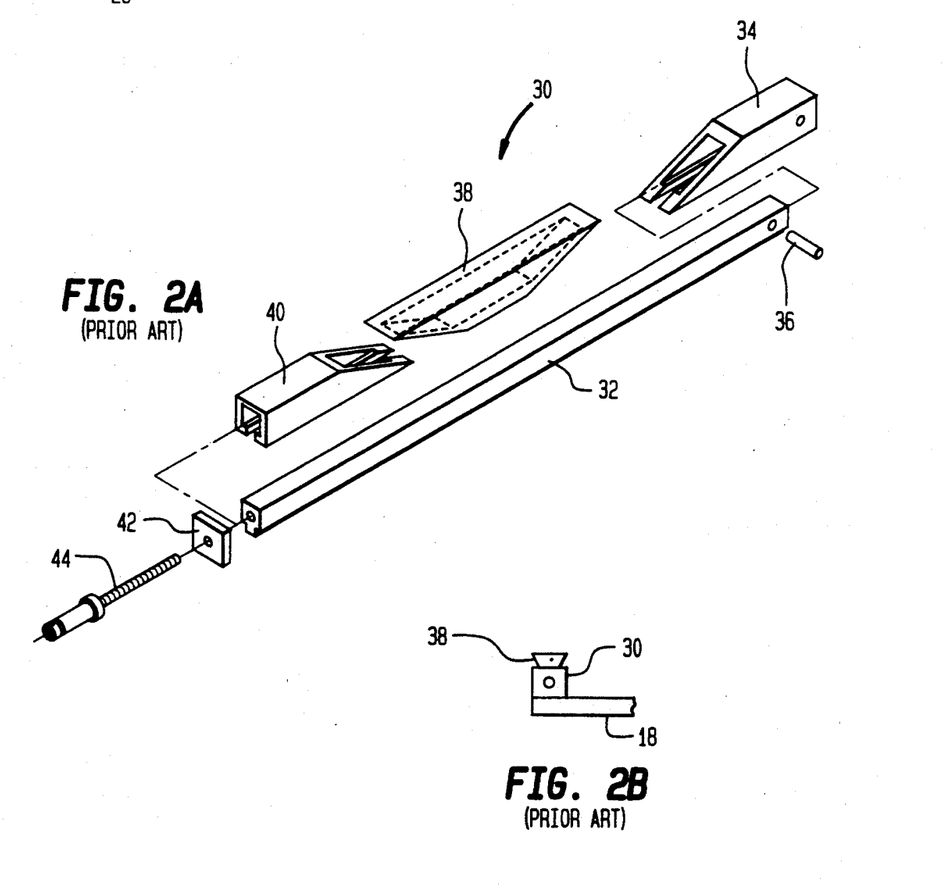
FIGS. 2A and 2B, respectively, are an exploded view and a side view of an edge guide that can be used in the system of FIG. 1.

An edge guide 30 fixed to heat sink plate 18 similar to the retainer disclosed in U.S. Pat. No. 4,819,713, is used to lock the heat sink plate into position relative to support 14. Edge guide 30 is shown in greater detail in FIGS. 2A and 2B. Referring to FIG. 2A, edge guide 30 includes T-shaped attachment portion 32, stationary portion 34, roll pin 36, moving portion 38, adjustable portion 40, aperture plate 42 and driving screw 44.

A T-shaped attachment portion 32 is fixed to heat sink plate 18 and has portions 34, 38 and 40 attached thereto. An adjustable portion 40 fits over and substantially encompasses the T-shaped attachment portion and has flanges which fit under the T-bar extensions of the attachment portion 32 so that the adjustable portion 40 can slide along the length of the T-shaped attachment portion 32. A stationary portion 34 is constructed and fits over the attachment portion 32 in the same manner as the adjustable portion 40, but is prevented from sliding along the length of the T-shaped attachment portion 32 by a roll pin 36 extending through stationary portion and the attachment portion 32.

A driving screw 44 passes within the adjustable portion 40 and through the aperture plate 42 into a threaded orifice in the attachment portion 32. Rotation of a screw 44 forces the plate 42 against adjustable portion 40 so that the adjustable portion moves along the attachment portion 32 toward the stationary portion 34.

A moving portion 38 rests on the attachment portion 32 prior to the locking of the heat sink plate 18 into position relative to the support 14. When the screw 44 is rotated as described above, the adjustable portion 40 is forced toward the portion 34 which causes the moving portion 38 to slide along inclined surfaces of portions 34 and 40 so that the moving portion 38 no longer contacts attachment portion 32, as illustrated in FIG. 2B. The driving screw 44 is rotated in this manner until the upper surface of the moving portion 38 contacts the fin located adjacent to and above the fin on which the heat sink plate is mounted. When the screw 44 is tightened after the upper surface of the moving portion 38 contacts the adjacent fin, the heat sink plate 18 is thereby locked into position relative to the support 14. The locking of the heat sink plate 18 into position serves to stabilize the mounting of the circuit board 20 and provides an additional heat flow path between the cold wall 22 and the heat-emanating electrical components 26 through the upper surface of the moving portion 38. Nevertheless, heat removal through the additional heat flow path is nearly nonexistent due to the relatively small surface area of the adjacent fin surface contacting the upper surface of the moving portion 38. More specifically, since the surface area of the upper surface of the moving portion 38 is relatively small due to its short length and width, heat removal through the upper surface of the moving portions is limited.

Figure 3:
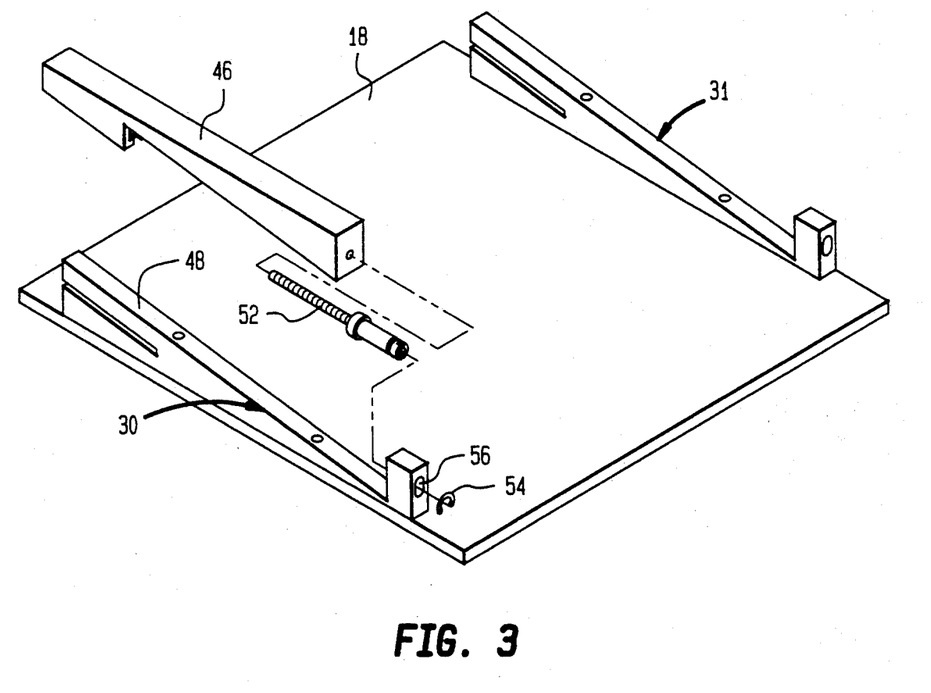
FIG. 3 is a perspective plan view of an edge guide system wherein the moving guide is substantially as long as the stationary guide.

An edge guide system as shown in FIG. 3 can be utilized in the previously used heat removing edge guide system of FIG. 1 in order to improve the performance thereof and to solve the above-mentioned problems related thereto. More particularly, the edge guide 30 in FIG. 1 can comprise a moving guide 46 and a stationary guide 48 as shown in FIG. 3. Since the moving guide 46 has an increased length corresponding substantially to the length of the stationary guide 48, the potential contact area associated with the upper surface of the moving guide 46 is also increased. As with the embodiment of FIG. 1, the heat sink plate 18 of FIG. 3 can have a circuit board that bears circuit components mounted thereon and a second edge guide 31 of the same construction as the edge guide 30 attached thereto.

Figure 4A:
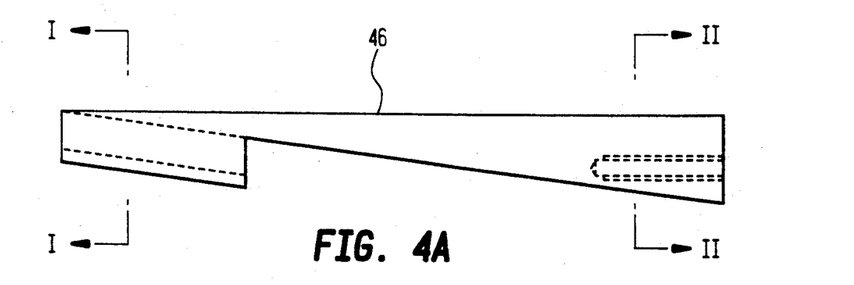
FIGS. 4A, 4B and 4C, respectively, are a side view, a cross-section view along line I—I, of FIG. 4A and a cross-section view along line II—II, of FIG. 4A of moving guide 46.
Figure 4B:
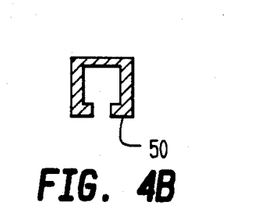
Figure 4C:
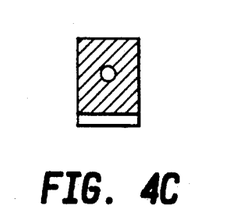

The moving guide 46 is illustrated in detail in Figs. 4A, 4B and 4C. As shown in FIG. 4B, the moving guide 46 has flanges 50 which are respectively positioned in grooves located on the side surfaces of the stationary guide. The moving guide 46 also has a receiving hole, as illustrated in FIG. 4C, for receiving an actuation screw.

Figure 5A:
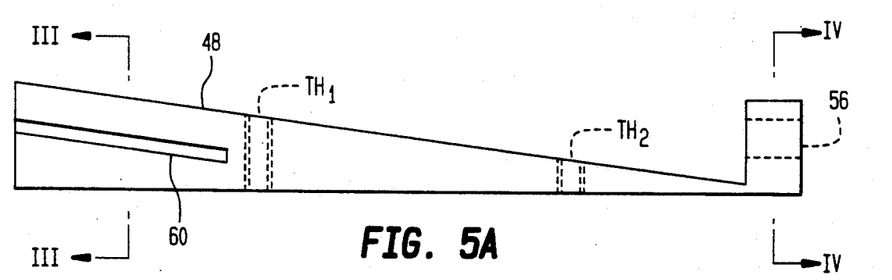
FIGS. 5A, 5B and 5C, respectively, are a side view, a cross-section view along line III—III, of FIG. 5A of a cross-section view along line IV—IV, of FIG. 5A of stationary guide 48.
Figure 5B:
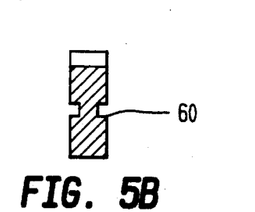
Figure 5C:
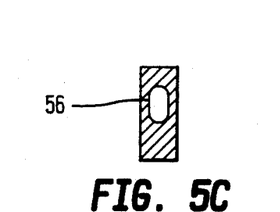

The stationary guide 48 is shown in detail in Figs. 5A, 5B and 5C. Grooves 60 are located on the side surfaces of the stationary guide 48 for accommodating the flanges of the moving guide 46. The stationary guide 48 is mounted to the heat sink plate by fasteners passing through the vertical threaded holes $TH_1$, $TH_2$ in the stationary guide shown in FIG. 5A. An actuation screw can pass through the aperture 56 in the stationary guide 48 for reception thereof in the moving guide.

Figure 6:
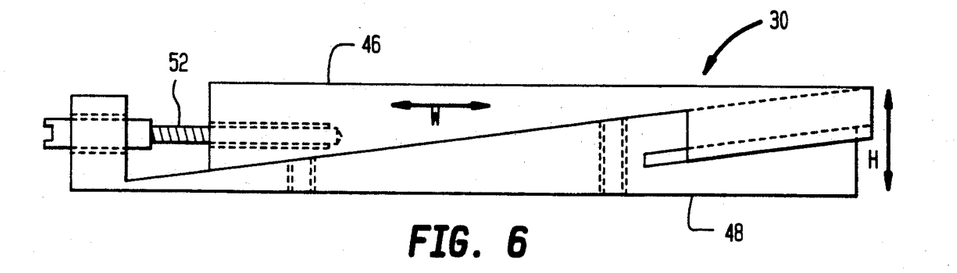
FIG. 6 is a side view of the moving guide slidably mounted on the stationary guide.

The function and manner of utilization of the edge guide system will now be described with reference to Figs. 1 and 3–6. A circuit board 20 bearing components 26 is mounted on the heat sink plate 18 having the stationary guide 48 of the edge guide 30 attached thereto. The moving guide 46 rests on the stationary guide 48, as illustrated in FIG. 6, with flanges 50 of the moving guide 46 disposed within the groove 60 of the stationary guide. The upper surface of the moving guide 46 is parallel to the upper mounting surface of the heat sink plate 18 on which the stationary guide 48 is mounted; the upper surface of the stationary guide 48 forms an oblique angle with respect to the mounting surface of the heat sink plate 18 so that sliding of moving guide 46 along the upper surface of stationary guide 48 causes a change in the distance h between the mounting surface of the heat sink plate 18 and the upper surface of the moving guide 46. Both the mounting surface of the heat sink plate 18 and the upper surface of the moving guide 46 are planar surfaces which maintain a mutually parallel relationship during the sliding of the moving guide along the upper surface of the stationary guide 48.

After the circuit board 20 is mounted on the heat sink plate 18, the latter is positioned so that it is supported by the fin 16 as shown in FIG. 1. Just as the fin 16 extends under the portion of the heat sink plate 18 on which the edge guide 30 is mounted, a similar fin (not shown) can extend beneath the portion of the heat sink plate on which the edge guide 31 is mounted so that the heat sink plate 18 is supported by a pair of fins. Next, the actuation screw 52, which extends into the moving guide 46 through the aperture 56 of the stationary guide 48, is rotated so that the moving guide 46 is displaced in the direction of arrow w. Since the upper surface of the stationary guide 48 is included, i.e., oblique with respect to the mounting surface of the heat sink plate 18, sliding of the moving guide 46 in a direction of arrow w will cause a change in the distance h between the upper surface of the moving guide 46 and the mounting surface of the heat sink plate.

Thus, in order to securely mount the heat sink plate 18 in the chassis, the actuation screw 52 is rotated so that distance h increases until the upper surface of the moving guide 46 firmly abuts against the lower surface of an adjacent fin located above the fin on which the heat sink plate is mounted. Conversely, upon removal of the heat sink plate 18 from the chassis 12, the screw 52 can be rotated in an opposite direction so that distance h is decreased and removal of the heat sink plate 18 from chassis 12 is facilitated.

Rotation of the actuation screw 52 until the upper surface of the moving guide 46 and the lower surface of the adjacent fin are in firm contact serves to lock the heat sink plate 18 into position. It should be noted that in addition to the washer 54, additional plain and spring washers can be used in association with the actuation screw 52. It should also be noted that the torque value generally associated with actuation screw 52 is in the range of 6 in-lbs. Grooves 60 and flanges 50 pilot the moving guide 46 so that lateral movement thereof is prevented during the sliding of the moving guide along the upper surface of the stationary guide 48.

Locking of the heat sink plate 18 into position in the manner described above provides stability in the edge guide system illustrated in FIG. 1, and furthermore provides an additional heat sink path through the upper surface of the moving guide 46, resulting in a substantial improvement in heat removal efficiency. In order to achieve such results, it is recommended that metals, alloys of metals, ceramics of other heat conducting materials should be used to fabricate the moving guide 46, the stationary guide 48, and the heat sink plate 18.

When proper heat conducting materials are used, a heat sink path can be formed between the components 26, circuit board 20, heat sink plate 18, edge guide 30 (including moving guide 46 and stationary guide 48), support 14 and chassis 12. Additional stability in the edge guide system of FIG. 1 is achieved when the actuation screw associated with the edge guide 31 is tightened until the moving guide of the edge guide 31 is moved into position.

Figure 7:
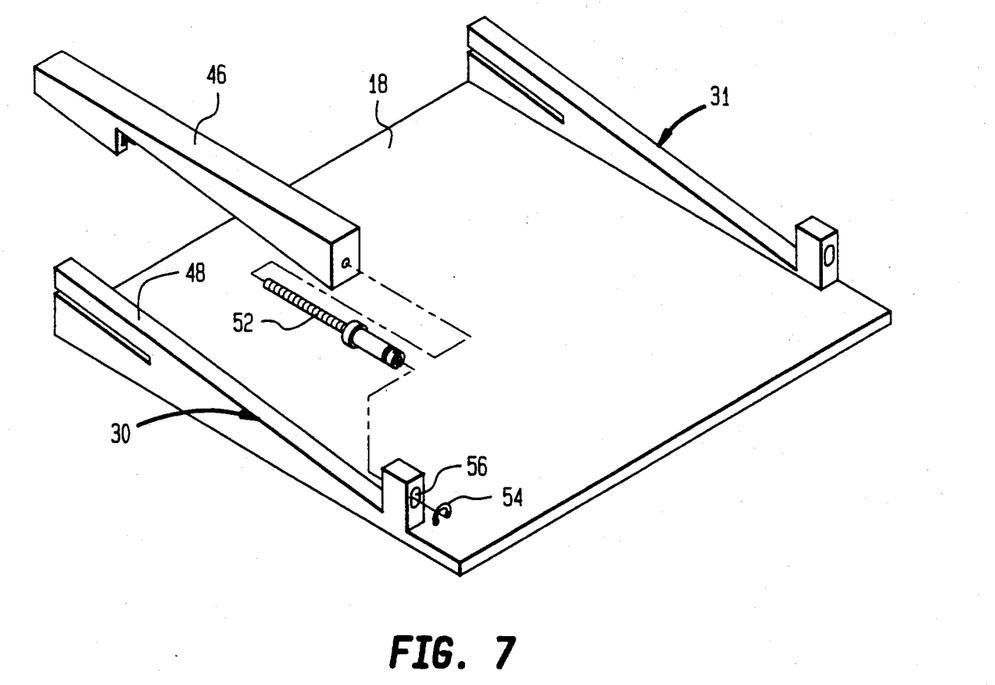
FIG. 7 is a perspective plan view of an edge guide system similar to the one shown in FIG. 3 but having an integral construction.

FIG. 7 shows an edge guide system similar to the one shown in FIG. 3 with the exception that the edge guide system of FIG. 7 has an integral construction. More specifically, the heat sink plate 18 and the stationary guide 48 of the edge guide system of FIG. 7 are fabricated integrally as a single unit so that the intermediate surface between the stationary guide and the heat sink plate is eliminated and so that thermal resistance in the edge guide system is decreased as compared to the amount of thermal resistance present in the system illustrated in FIG. 1.

Figure 8:
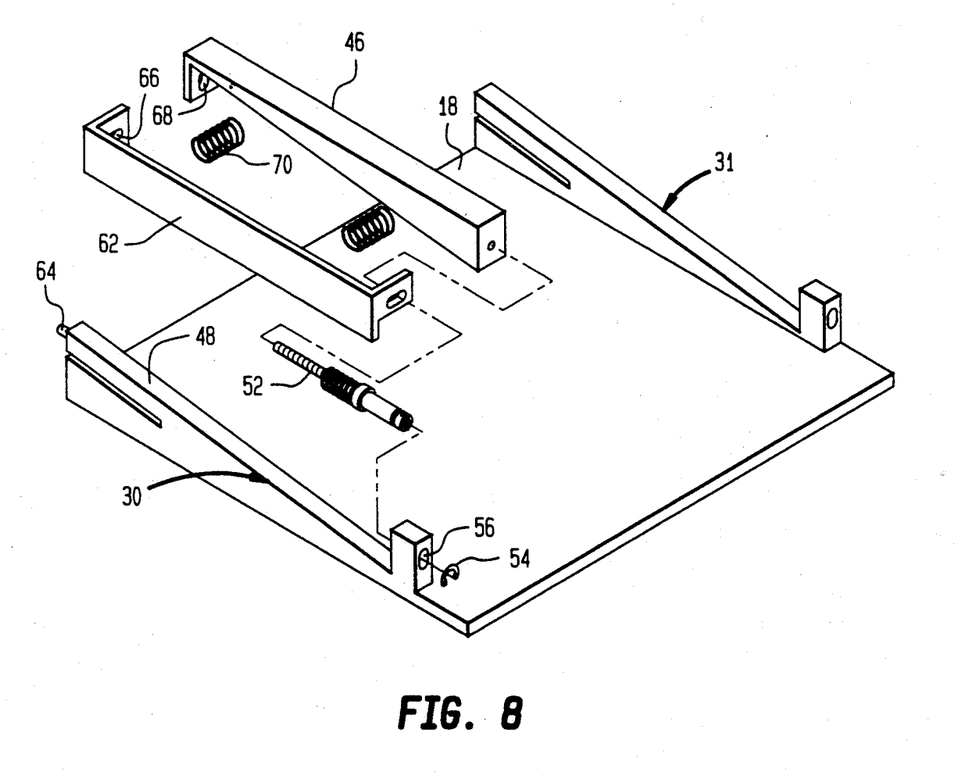
FIG. 8 is a perspective plan view of an edge guide system including a stationary guide, a moving guide, and a side guide.

The edge guide system of FIG. 8 is identical to the one shown in FIG. 7 except that the edge guide system of FIG. 8 is equipped with a spring loaded side guide 62 and utilizes a roll pin rather than a groove and flange arrangement for preventing lateral movement of the moving guide 46 as it slides along the upper surface of the stationary guide 48. Additionally, the actuation screw 52 in FIG. 8 is equipped with a biasing spring for biasing the side guide 62 against the moving guide 46 in a direction corresponding to the longitudinal axis of the actuation screw 52.

Like the heat sink plate, the moving guide and the stationary guide of the previously described edge guide systems, the side guide 62 can be fabricated with any suitable heat conducting material, including metals, alloys of metals, ceramics, or the like. The edge guide 31 of FIG. 8 has nearly the same structure as edge guide 30 except that the outer surface of the side guide associated with the edge guide 31 (not shown) faces in one direction while the outer surface of the side guide 62, which is associated with the edge guide 30, faces in an opposite direction.

In FIG. 8, the roll pin 64 passes through aperture 66 in the side 62 and the aperture 68 in the moving guide 46, and acts to prevent lateral movement of the moving guide as it slides along the upper surface of the stationary guide 48 in the axial direction of the roll pin. Additionally, the roll pin 64 acts as a support for the side guide 62.

The function and manner of utilization of the edge guide system of FIG. 8 will now be described with reference to FIGS. 1 and 8. As with the previously-described edge guide systems, a circuit board 20 bearing components 26 is mounted on the heat sink plate 18, which rests on the fin 16, and the actuation screw 52 is rotated until the upper surface of the moving guide 46 contacts an adjacent fin located above the fin on which the heat sink plate rests. However, unlike the previously-described systems, the outer surface of a spring loaded side guide 62 is biased away from moving guide 46 and toward the wall 22 by springs so that firm contact is achieved between the wall and the outer surface of the side guide 62. More specifically, springs (e.g., spring 70) bias the outer surface of the side guide 62 away from the moving guide 46 so that the outer surface of the side guide contacts the wall 22 as the moving guide 46 slides along the upper surface of the stationary guide 48. In this manner, the mounting stability of the heat sink plate 18 is enhanced while yet another additional heat flow path is provided.

By varying the distance between the upper surface of the moving guide 46 and the mounting surface of the heat sink plate 18 and the distance between the wall 22 and the outer surface of the side guide 62, the upper surface of the moving guide is brought into contact with an adjacent fin and the outer surface of the side guide is brought into contact with the wall surface so that heat can flow to the support 14 and the chassis 22 through the upper surface of the moving guide 46, the outer surface of side guide 62, and the bottom surface of the heat sink plate 18. Additional heat removal and system stability can be achieved by adjusting the moving guide and side guide associated with the edge guide 31 so that both of these guides contact the support from which the fin disposed beneath the edge guide 31 extends.

Figures 9, 9A:
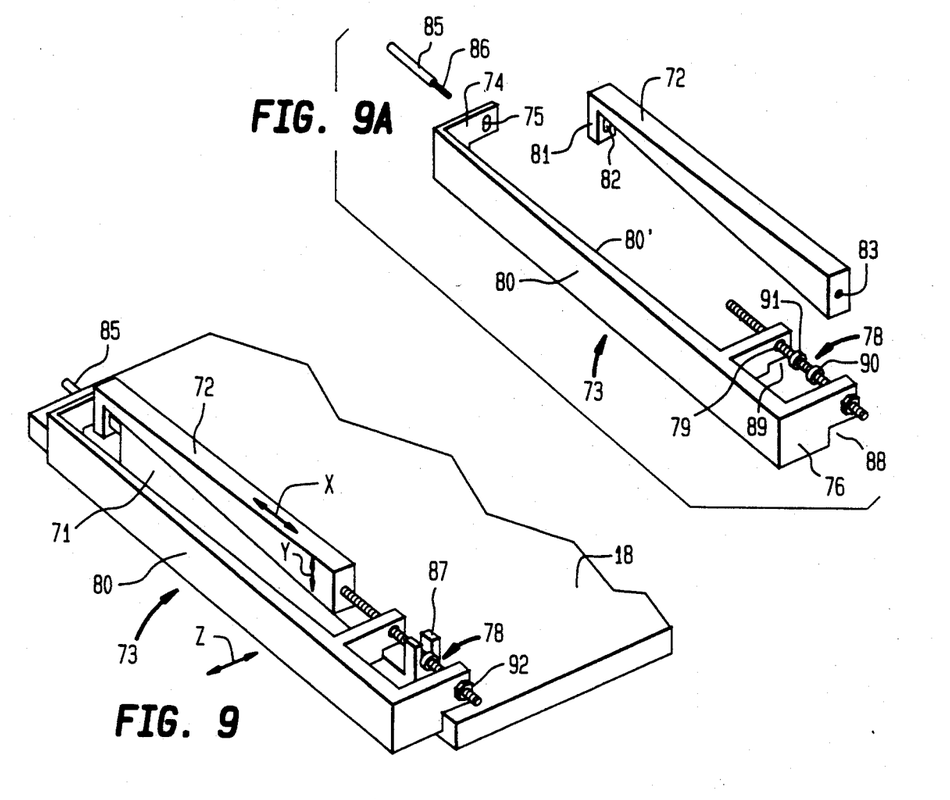
FIG. 9, is a perspective plan view of an edge guide system showing yet another embodiment with a side guide.
FIG. 9A is a perspective exploded view of the moving guide and side guide shown in the system in FIG. 9.
Figure 9B:
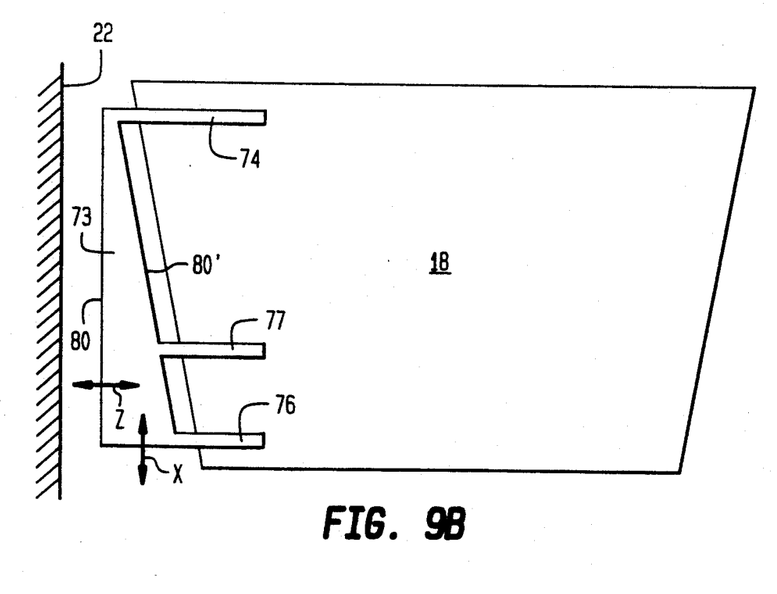
FIG. 9B is a top plan view of the system shown in FIG. 9 showing a side guide in relation to a chassis support wall but without the presence of a top guide.

Another embodiment of the edge guide system using a side guide is shown in FIG. 9, 9A and 9B. In this embodiment, a side guide 73 has a protruding end portion 74 in which an elongated aperture 75 is provided. The other end 76 of the side guide 73 carries a threaded screw 78. To this end, an intermediate protruding wall 77 extends from the side guide 73 and is provided with an aperture 79 having a diameter sufficient to permit the screw 78 to pass therethrough and to permit the side guide 73 to move in the direction of arrows Z as well as in the direction of arrows X. An inner surface 80', which is opposite outer surface 80 of the side guide 73, is wedged-shaped in that the wall thickness at the end portion 74 is thinner than the wall thickness at the end portion 76, as best seen in FIG. 9B, so that the outer surface 80 is not parallel to the inner surface 80, but the inner surface 80, is parallel to the edge of the plate 18. The moving guide 72 has a protruding portion 81 at one end with an elongated aperture 82 therethrough and a threaded aperture 83 at the other end for matingly receiving the screw 78. A roll pin 85 with a reduced threaded portion 86 passes through the elongated aperture 75 in the side guide 73 and through the elongated aperture 82 of the moving top guide 72 such that the threaded portion 86 is received within the stationary guide 71. The pin 85 permits the top guide 72 and the side guide 73 to move relative to the stationary guide 71 and yet provides stable support for the moving guides 72, 73 to maintain the desired stability in the mounting of the circuit board within the chassis. In this connection, the roll pin 85 serves a purpose similar to the roll pin 64 of FIG. 8 insofar as it acts to prevent lateral movement of the top guide 72 as the latter rests and falls along the Y-axis upon turning of the screw 78. The projecting member 87 fixed to the plate 18 has an elongated aperture and provides a similar function in that it permits vertical but not Z-axis movement of the screw 78.

The end portion 76 and the intermediate wall 77 have L-shaped notches 88, 89, respectively, so that the side guide 73 travels parallel to the edge of the plate 18. Also, the roll pin 85 maintains stability as the side guide 73 is moved in the X-axis direction by rotation of the screw 78 as the side guide 73 is wedged against the wall 22 (FIG. 1) of the support 14 in the chassis (12). The screw 78 is a known double acting screw which allows independent adjustment of the top guide 72 and the side guide 73 so as to maximize the thermally conductive flow heat path through both the fins 16 and the wall 22. For this purpose, adjusting knobs 90, 91 are provided on each side of the projecting member 87. A nut 92 can be provided to lock the screw 78 in plate after the moving guides have been adjusted to their desired position.

The edge guide system of the present invention carries out heat removal in an efficient manner and is useful for ensuring mounting stability in mounted circuit board system. In comparison with previously used edge guide systems, the non-integral edge guide system of the present invention relates in decreased thermal resistance in the range of 8.9% to 14.8%, while the integral edge guide system of the present invention results in decreased thermal resistance in the range of 37.8% to 43.9%.

While the invention has been described in terms of its preferred embodiments, it is intended that numerous modifications may be made thereto without departing from the spirit and scope of the invention as defined in the appended claims.

What is claimed:

1. A heat removing edge guide system for removing heat from a circuit board comprising:
   heat sink means for removing heat from a circuit board, said heat sink means constituting a mounting surface;
   a stationary guide on an edge portion of the mounting surface of said heat sink means, said stationary guide having an upper surface defining a single plane and inclined with respect to the mounting surface;
   a solid moving guide configured to provide a large contact surface for heat removal and having an uninterrupted upper surface facing away from said heat sink means and a lower complimentary single plane surface contacting only the single upper surface of said stationary guide for slidably mounting the moving guide on the stationary guide, said moving guide, said stationary guide and said heat sink means forming a thermally conductive path; and
   said moving guide and said stationary guide being configured such that sliding of said moving guide along the upper surface of said stationary guide causes a change in the distance between the mounting surface of said heat sink means and the upper surface of said moving guide;
   further comprising pilot means for preventing lateral movement of said moving guide during the sliding of said moving guide along the upper surface of said stationary guide;
   wherein said pilot means is a component of said stationary guide;
   wherein said moving guide further includes a pilot means interacting with said stationary guide pilot means, for preventing lateral movement of said moving guide during the sliding of said moving guide along the upper surface of said stationary guide;
   wherein said stationary guide pilot means comprises a first groove in a first side surface of said stationary guide and a second groove in a second side surface of said stationary guide, said first and second side surface being located on opposite sides of the upper surface of said stationary guide; and
   said movable guide pilot means comprises a first flange slidably disposed in the first groove and a second flange slidably disposed in the second groove, said first flange and said second flange sliding within the first and second grooves, respectively, during the sliding of said moving guide along the upper surface of said stationary guide.

2. A heat removing edge guide system for removing heat from a circuit board comprising:
   heat sink means for removing heat from a circuit board, said heat sink means constituting a mounting surface;
   a stationary guide on an edge portion of the mounting surface of said heat sink means, said stationary guide having an upper surface defining a single plane and inclined with respect to the mounting surface;
   a solid moving guide configured to provide a large contact surface for heat removal and having an uninterrupted upper surface facing away from said heat sink means and a lower complimentary single plane surface contacting only the single upper surface of said stationary guide for slidably mounting the moving guide on the stationary guide, said moving guide, said stationary guide and said heat sink means forming a thermally conductive path; and
   said moving guide and said stationary guide being configured such that sliding of said moving guide along the upper surface of said stationary guide causes a change in the distance between the mounting surface of said heat sink means and the upper surface of said moving guide;
   further comprising pilot means for preventing lateral movement of said moving guide during the sliding of said moving guide along the upper surface of said stationary guide;
   wherein said pilot means is a component of said stationary guide;
   wherein:
   said stationary guide pilot means comprises a roll pin extending from said stationary guide in a direction corresponding to the sliding of said moving guide along the upper surface of said stationary guide; and
   said movable guide pilot means comprises an apertured surface in said moving guide through which said roll pin extends, said apertured surface moving relative to said roll pin during the sliding of said moving guide along the upper surface of said stationary guide.

3. A heat removing edge guide system for removing heat from a circuit board comprising:
   heat sink means for removing heat from a circuit board said heat sink means constituting a mounting surface;
   a stationary guide on an edge portion of the mounting surface of said heat sink means, said stationary guide having an upper surface defining a single plane and inclined with respect to the mounting surface;
   a solid moving guide configured to provide a large contact surface for heat removal and having an uninterrupted upper surface facing away from said heat sink means and a lower complimentary single plane surface contacting only the single upper surface of said stationary guide for slidably mounting the moving guide on the stationary guide, said moving guide, said stationary guide and said heat sink means forming a thermally conductive path; and
   said moving guide and said stationary guide being configured such that sliding of said moving guide along the upper surface of said stationary guide causes a change in the distance between the mounting surface of said heat sink means and the upper surface of said moving guide;

further comprising:

a side guide mounted on said moving guide and comprising an outer surface facing away from said moving guide; wherein said side guide forms a part of the thermally conductive path, and said side guide is positionally adjustable with respect to said moving guide so that the distance between said moving guide and the outer surface of said side guide can be varied without breaking the thermal conductive path.

4. A heat removing edge guide system according to claim 3, further comprising a spring for biasing the outer surface of said side guide away from said moving guide.

5. A heat removing edge guide system for removing heat from a circuit board comprising:

heat sink means for removing heat from a circuit board, said heat sink means comprising a mounting surface;

support means comprising a wall and a plurality of spaced fins extending from said wall for supporting said heat sink means;

a stationary guide on the mounting surface of said heat sink means, said stationary guide comprising an upper surface defining a single plane that forms an angle with respect to the mounting surface;

a solid moving guide configured to provide a large contact surface for heat removal and slidably mounted on said stationary guide and comprising an upper uninterrupted surface facing away from said heat sink means and a lower complimentary single plane surface contacting only the upper surface of said stationary guide, with said moving guide, said stationary guide, said heat sink means and said support means forming a thermally conductive path; and said moving guide and said stationary guide being configured such that sliding of said moving guide along the upper surface of said stationary guide causes a change in the distance between the mounting surface of said heat sink means and the upper surface of said moving guide and results in contact between one of said spaced fins and the upper surface of said moving guide;

further comprising:

a side guide mounted on said moving guide and comprising an outer surface facing away from said moving guide; wherein said side guide forms a part of the thermally conductive path, and said side guide is positionally adjustable with respect to said moving guide so that the distance between said moving guide and the outer surface of said side guide can be varied in order to cause contact between said wall and the outer surface of said side guide without breaking the thermally conductive path.

6. A heat removing edge guide system according to claim 5, further comprising a spring for biasing the outer surface of said side guide away from said moving guide.

* * * * *